(12) United States Patent
Spitzer et al.

(10) Patent No.: US 12,439,571 B2
(45) Date of Patent: Oct. 7, 2025

(54) THERMAL ELEMENT FOR A CURRENT SENSING STRUCTURE

(71) Applicant: Infineon Technologies AG, Neubiberg (DE)

(72) Inventors: Dietmar Spitzer, Völkermarkt (AT); Giampiero Ciammetti, Villach (AT); Gaetano Formato, Villach (AT)

(73) Assignee: Infineon Technologies AG, Neubiberg (DE)

( * ) Notice: Subject to any disclaimer, the term of this patent is extended or adjusted under 35 U.S.C. 154(b) by 165 days.

(21) Appl. No.: 18/181,994

(22) Filed: Mar. 10, 2023

(65) Prior Publication Data
US 2024/0306350 A1    Sep. 12, 2024

(51) Int. Cl.
*H05K 7/20* (2006.01)
*G01R 15/20* (2006.01)

(52) U.S. Cl.
CPC ........... *H05K 7/209* (2013.01); *G01R 15/207* (2013.01)

(58) Field of Classification Search
CPC ............................. H05K 7/209; G01R 15/207
USPC .................................. 324/126, 117 H, 117 R
See application file for complete search history.

(56) References Cited

U.S. PATENT DOCUMENTS

| | | | |
|---|---|---|---|
| 2005/0004568 A1* | 1/2005 | Lawes | A61B 18/1442 606/51 |
| 2015/0207002 A1* | 7/2015 | Moslehi | H01L 31/0465 438/71 |
| 2020/0011902 A1* | 1/2020 | Shimizu | G01R 19/0092 |
| 2020/0036064 A1* | 1/2020 | Hess | H01M 10/625 |

FOREIGN PATENT DOCUMENTS

DK    102004054317 A1 *   5/2006

\* cited by examiner

*Primary Examiner* — Farhana A Hoque
(74) *Attorney, Agent, or Firm* — Harrity & Harrity, LLP

(57) ABSTRACT

A system may include a busbar to conduct a current. The busbar may include a sensing structure. The system may include a magnetic sensor to sense a magnetic field produced by the current in the busbar. The magnetic sensor may be arranged near the sensing structure. The system may include a thermal element in or near the sensing structure. The thermal element may facilitate dissipation of heat through the sensing structure of the busbar.

22 Claims, 4 Drawing Sheets

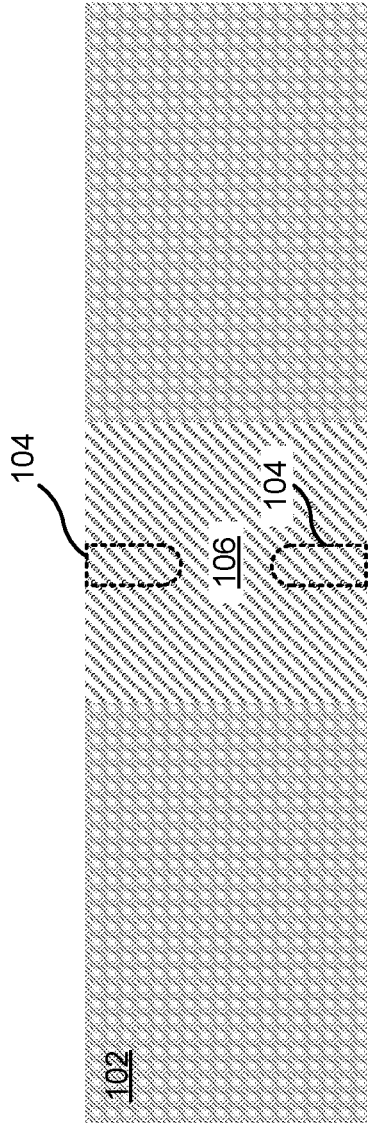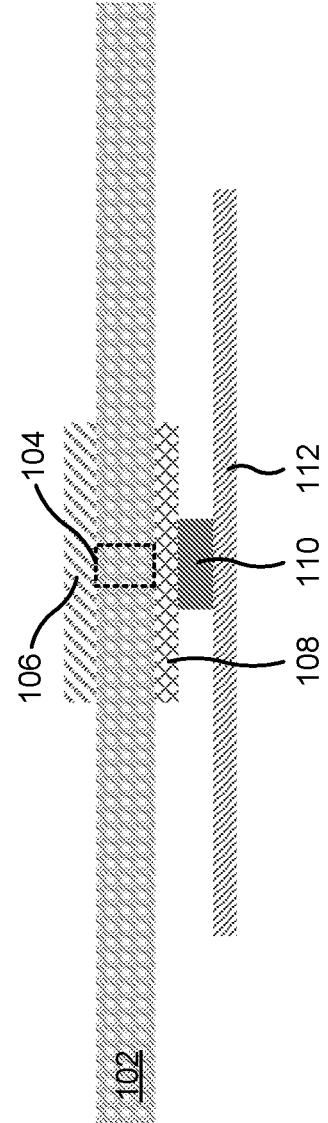
FIG. 2A
FIG. 2B

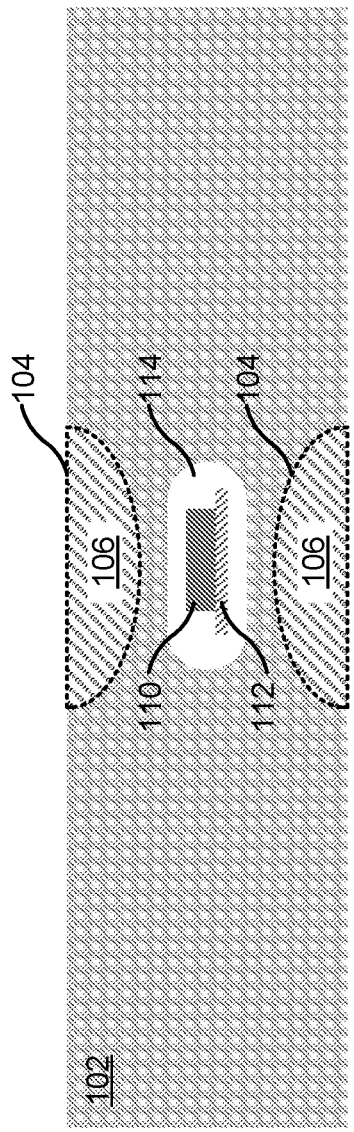
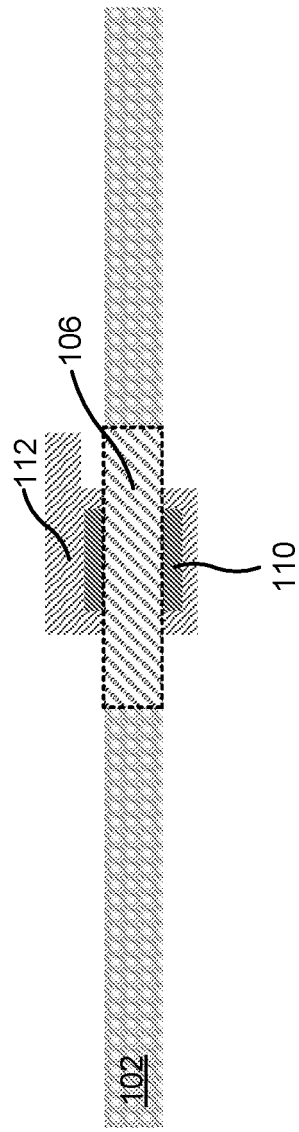
FIG. 3A
FIG. 3B

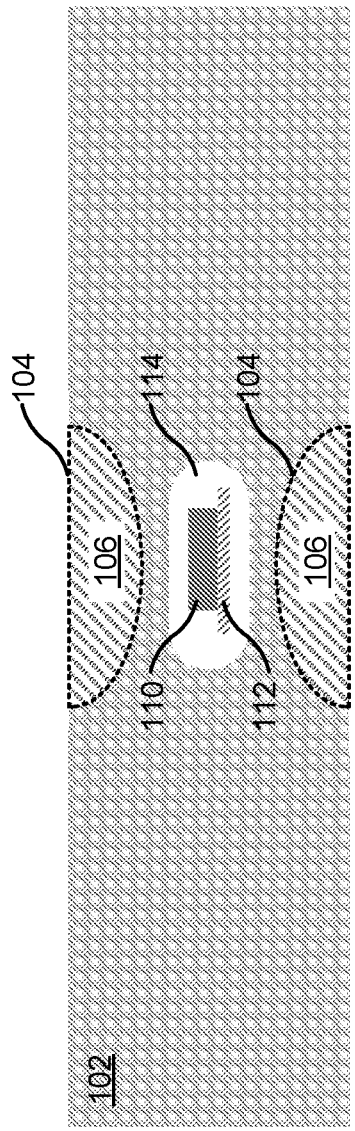
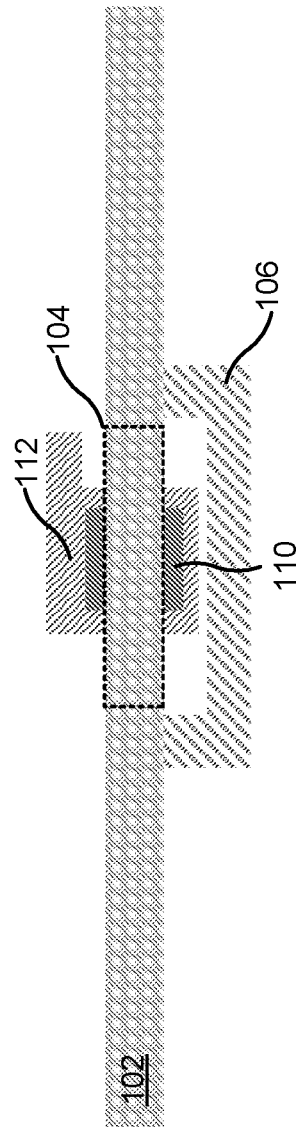
FIG. 4A
FIG. 4B

THERMAL ELEMENT FOR A CURRENT SENSING STRUCTURE

BACKGROUND

Measurement of an electric current may be needed in a variety of applications, such as in a battery system in an electric vehicle, in an electric motor, in a power distribution system, or a circuit, among other examples. An electric current flowing through a current-carrying conductor produces a magnetic field with a magnetic field flux density that is proportional to a magnitude of the electric current. Therefore, a magnetic field sensor can be used as a current sensor. By placing a magnetic field sensor near the current-carrying conductor, the magnetic field sensor can generate a measurable quantity, such as a voltage, that is proportional to the magnetic field sensed by the magnetic field sensor. The magnetic field flux density in a space around the current-carrying conductor reduces inversely with increasing distance from the current-carrying conductor. Therefore, a sensor element of the magnetic field sensor may be placed in close proximity to the current-carrying conductor.

SUMMARY

In some implementations, a system includes a busbar to conduct a current, wherein the busbar includes a sensing structure; a magnetic sensor to sense a magnetic field produced by the current in the busbar, wherein the magnetic sensor is arranged near the sensing structure; and a thermal element in or near the sensing structure, wherein the thermal element facilitates dissipation of heat through the sensing structure of the busbar.

In some implementations, a system includes a busbar including a sensing structure, wherein the sensing structure comprises one or more slits or tapers formed in the busbar; and a thermal element associated with one or more portions of the sensing structure.

In some implementations, a system includes a busbar to conduct a current and to provide dissipation of heat from a power device, wherein the busbar includes a sensing structure associated with increasing a magnetic field produced by the current; a magnetic sensor to sense the magnetic field produced by the current in the busbar near the sensing structure; and a thermal element to facilitate the dissipation of the heat from the power device through the sensing structure of the busbar, wherein the thermal element comprises a thermal filler premold that is within one or more portions of the sensing structure or comprises a thermal plate that is on or over one or more portions of the sensing structure.

BRIEF DESCRIPTION OF THE DRAWINGS

FIGS. 2A and 2B are diagrams of a second example implementation associated with a thermal element for a current sensing structure.

FIGS. 3A and 3B are diagrams of a third example implementation associated with a thermal element for a current sensing structure.

FIGS. 4A and 4B are diagrams of a fourth example implementation associated with a thermal element for a current sensing structure.

DETAILED DESCRIPTION

Figures 1A, 1B:
FIGS. 1A and 1B are diagrams of a first example implementation associated with a thermal element for a current sensing structure.

The following detailed description of example implementations refers to the accompanying drawings. The same reference numbers in different drawings may identify the same or similar elements.

A magnetic sensor may be utilized for measurement of a current through a current-carrying conductor, such as a busbar. In practice, the busbar may include a sensing structure, such as a slit, a taper, a notch, or an opening, that serves to reduce an area of the busbar through which the current flows near the magnetic sensor, which increases a magnetic field produced by the current at the magnetic sensor, thereby facilitating sensing of the magnetic field and improving sensor performance.

In some systems, a current sensor used for measuring current in a busbar is mounted near (e.g., within a few centimeters of) a power device, such as an insulated-gate bipolar transistor (IGBT) device, a silicon carbide (SiC) device, or a gallium nitride (GaN) device, among other examples. In some such systems, the power device may be designed so that the busbar is used to provide cooling of the power device (e.g., rather than cooling being provided through a back plate of the power device). In such a system, while a sensing structure of the busbar may not generate a hot spot, the sensing structure may act as a barrier for dissipation of heat coming from the power device. Further, the sensing structure may mechanically weaken the busbar, meaning that a likelihood of cracking or breaking is increased due to the sensing structure.

Some implementations described herein provide a thermal element for a current sensing structure. In some implementations, a system may include a busbar, a magnetic sensor, and the thermal element. In some implementations, the busbar is to conduct a current and includes a sensing structure (e.g., one or more slits, one or more tapers, or the like). In some implementations, the magnetic sensor is to sense a magnetic field produced by the current in the busbar, with the magnetic sensor being arranged near (e.g., within a few centimeters of) the sensing structure. In some implementations, the thermal element is in or near the sensing structure and facilitates dissipation of heat through the sensing structure of the busbar. In some implementations, the thermal element facilitates dissipation of heat coming from another device, such as a power device near which the magnetic sensor is arranged. Further, the thermal element may in some implementations improve mechanical stability of the busbar, thereby reducing a likelihood of cracking or breaking of the busbar. Additional details are provided below.

FIGS. 1A and 1B are diagrams of a first example system 100 associated with a thermal element for a current sensing structure. As shown in FIGS. 1A and 1B, the system 100 includes a busbar 102, a sensing structure 104, a thermal element 106, an isolation element 108, a magnetic sensor 110, and a printed circuit board (PCB) 112. FIGS. 1A and 1B show a top view and a side view of the example system 100, respectively.

The busbar 102 is a current-carrying conductor via which a current is to flow. Thus, the busbar 102 in some implementations comprises a conductive material, such as copper. In some implementations, the busbar 102 may be designed so as to enable dissipation of heat from another device. For example, a power device (not shown) may be mounted on or over the busbar 102 such that heat from the power device is to be dissipated through the busbar 102 (e.g., in an x-direction, in the example system 100).

In some implementations, as shown in example system 100, the busbar 102 includes a sensing structure 104. The sensing structure 104 is a structure that serves to reduce a size of an area of the busbar 102 through which the current flows near the magnetic sensor 110. Thus, the sensing structure 104 may serve to increase a magnetic field produced by the current near the magnetic sensor 110, thereby facilitating sensing of the magnetic field by the magnetic sensor 110. In some implementations, as shown in FIGS. 1A and 1B, the sensing structure 104 comprises a set of slits formed within the busbar 102. Additionally, or alternatively, the sensing structure 104 may include another type of structure formed within the busbar 102, such as a notch, a taper, or an opening, among other examples.

The magnetic sensor 110 is a device configured to sense the magnetic field produced by the current in the busbar 102. In some implementations, the magnetic sensor 110 is mounted on the PCB 112. In some implementations, the magnetic sensor 110 is arranged near the sensing structure 104 (e.g., such that the magnetic sensor 110 is near the increased magnetic field as provided by the sensing structure 104). For example, in the system 100, the magnetic sensor 110 is arranged directly below the sensing structure 104. In some implementations, the magnetic sensor 110 is separated from the busbar 102 by the isolation element 108. The isolation element 108 is an element that provides electrical isolation of the magnetic sensor 110 from the busbar 102 (e.g., such that electrical signals do not pass from the busbar 102 to the magnetic sensor 110). In some implementations, as shown in the system 100, the magnetic sensor 110 is arranged adjacent to the busbar 102 such that a plane of the magnetic sensor 110 (e.g., a plane of a top surface of the magnetic sensor 110) is substantially parallel to a plane of the busbar 102. Such an arrangement may be referred to as a horizontal insertion arrangement. Alternatively, the magnetic sensor 110 may in some implementations be arranged within an opening in the busbar 102 such that the plane of the magnetic sensor 110 is perpendicular to the plane of the busbar 102. Such an arrangement may be referred to as a vertical insertion arrangement, examples of which are provided below.

The thermal element 106 is an element that is configured to facilitate dissipation of heat through the sensing structure 104 of the busbar 102. In some implementations, the thermal element 106 may additionally provide structural support for the busbar 102 (e.g., such that a likelihood of cracking or breaking of the busbar 102 is reduced). In some implementations, the thermal element 106 may be in or near the sensing structure 104. For example, in the example system 100, the thermal element 106 is formed such that the thermal element 106 at least partially fills slits that form the sensing structure 104. Other example implementations of the sensing structure 104 and the thermal element 106 are described below.

In some implementations, the thermal element 106 comprises a thermal filler premold that is formed within one or more portions of the sensing structure. For example, in the system 100, the thermal element 106 is a thermal filler premold formed such that the thermal element 106 fills in the slits of the sensing structure 104. Alternatively, the thermal element may in some implementations comprise a thermal plate that is arranged on, over, or around one or more portions of the sensing structure 104.

In some implementations, the thermal element 106 comprises a highly electrically insulating material. For example, the thermal element 106 may in some implementations comprise a material with a comparative tracking index (CTI) that is greater than approximately 250 volts (V). Such a material may be used in order to prevent current leakage through the thermal element 106, thereby enabling the magnetic field to be increased by the sensing structure 104 in order to enable magnetic sensing by the magnetic sensor 110.

Additionally, or alternatively, the thermal element 106 in some implementations comprises a non-magnetic material. A non-magnetic material may be used to prevent distortion of the magnetic field by the thermal element 106, thereby preventing a degradation in sensing by the magnetic sensor 110.

Additionally, or alternatively, the thermal element 106, in some implementations, comprises a material with a coefficient of thermal expansion (CTE) that matches (e.g., differs by 5% or less from) a CTE of a material of the busbar. In some implementations, the CTE matching of the thermal element 106 and the busbar 102 enables structural integrity of the busbar 102 and thermal element 106 over temperature changes by, for example, reducing stress at an interface between the busbar 102 and the thermal element 106 as temperature changes in an environment of the system 100.

Additionally, or alternatively, the thermal element 106 in some implementations comprises a material with a high thermal conductivity. For example, the thermal element 106 may comprise a material with a thermal conductivity that is greater than approximately 5 Watts per meter Kelvin (W/(m·K)). In some implementations, the use of such a material facilitates dissipation of heat through the sensing structure 104 (e.g., by enabling heat to be dissipated through the thermal element 106), thereby improving thermal performance of the system 100 by enabling heat dissipation through the sensing structure 104.

In some implementations, the thermal element 106 may be, for example, an epoxy resin or another type of material that exhibits one or more of the characteristics described above.

As indicated above, FIGS. 1A and 1B are provided as an example. Other examples may differ from what is described with regard to FIGS. 1A and 1B. The number and arrangement of devices and elements shown in FIGS. 1A and 1B are provided as an example. In practice, there may be additional devices or elements, fewer devices or elements, different devices or elements, or differently arranged devices or elements than those shown in FIGS. 1A and 1B.

FIGS. 2A and 2B are diagrams of a second example system 200 associated with a thermal element for a current sensing structure. As shown in FIGS. 2A and 2B, an example system 200 includes a busbar 102, a sensing structure 104, a thermal element 106, an isolation element 108, a magnetic sensor 110, and a PCB 112. FIGS. 2A and 2B show a top view and a side view of the example system 200, respectively.

In the system 200, the magnetic sensor 110 is arranged with respect to the busbar 102 such that a plane of the magnetic sensor 110 is parallel to a plane of the busbar 102 (e.g., the magnetic sensor 110 is in the horizontal insertion arrangement).

Further, in the system 200, the thermal element 106 includes a thermal plate that is arranged over the sensing structure 104. Notably, in FIG. 2A, the dashed lines illustrate the sensing structure 104 as seen through the thermal element 106, and the thermal element 106 does not fill the sensing structure 104. Thus, in the system 200, the thermal element 106 is arranged on or over the busbar 102 such that the thermal element 106 covers the sensing structure 104 (without filling the sensing structure 104). In some implementations, such an arrangement facilitates molding of the thermal element 106 in a package with one or more other elements, such as the isolation element 108 and the magnetic sensor 110.

As indicated above, FIGS. 2A and 2B are provided as an example. Other examples may differ from what is described with regard to FIGS. 2A and 2B. The number and arrangement of devices and elements shown in FIGS. 2A and 2B are provided as an example. In practice, there may be additional devices or elements, fewer devices or elements, different devices or elements, or differently arranged devices or elements than those shown in FIGS. 2A and 2B.

FIGS. 3A and 3B are diagrams of a third example system 300 associated with a thermal element for a current sensing structure. As shown in FIGS. 3A and 3B, an example system 300 includes a busbar 102 with an opening 114, a sensing structure 104, a thermal element 106, a magnetic sensor 110, and a PCB 112. FIGS. 3A and 3B show a top view and a side view of the example system 300, respectively.

In the system 300, the magnetic sensor 110 is arranged with respect to the busbar 102 such that a plane of the magnetic sensor 110 is perpendicular to a plane of the busbar 102 (e.g., the magnetic sensor 110 is in the vertical insertion arrangement).

Further, in the system 300, the sensing structure 104 comprises a set of tapers in the busbar 102, and the thermal element 106 comprises a premold that fills the tapers in the busbar 102.

As indicated above, FIGS. 3A and 3B are provided as an example. Other examples may differ from what is described with regard to FIGS. 3A and 3B. The number and arrangement of devices and elements shown in FIGS. 3A and 3B are provided as an example. In practice, there may be additional devices or elements, fewer devices or elements, different devices or elements, or differently arranged devices or elements than those shown in FIGS. 3A and 3B.

FIGS. 4A and 4B are diagrams of a fourth example implementation associated with a thermal element for a current sensing structure. As shown in FIGS. 4A and 4B, an example system 400 includes a busbar 102 with an opening 114, a sensing structure 104, a thermal element 106, a magnetic sensor 110, and a PCB 112. FIGS. 4A and 4B show a top view and a side view of the example system 100, respectively.

In the system 400, the magnetic sensor 110 is arranged with respect to the busbar 102 such that a plane of the magnetic sensor 110 is perpendicular to a plane of the busbar 102 (e.g., the magnetic sensor 110 is in the vertical insertion arrangement).

Further, in the system 400, the thermal element 106 includes a thermal plate that is arranged to fit around the sensing structure 104 and the magnetic sensor 110. Notably, in FIG. 4A, the thermal element 106 does not fill the sensing structure 104. Thus, in the system 400, the thermal element 106 is arranged on or below the busbar 102 such that the thermal element 106 at least partially covers the sensing structure 104 (without filling the sensing structure 104).

As indicated above, FIGS. 4A and 4B are provided as an example. Other examples may differ from what is described with regard to FIGS. 4A and 4B. The number and arrangement of devices and elements shown in FIGS. 4A and 4B are provided as an example. In practice, there may be additional devices or elements, fewer devices or elements, different devices or elements, or differently arranged devices or elements than those shown in FIGS. 4A and 4B.

The foregoing disclosure provides illustration and description, but is not intended to be exhaustive or to limit the implementations to the precise forms disclosed. Modifications and variations may be made in light of the above disclosure or may be acquired from practice of the implementations.

As used herein, the terms "substantially" and "approximately" mean "within reasonable tolerances of manufacturing and measurement." For example, the terms "substantially" and "approximately" may be used herein to account for small manufacturing tolerances or other factors (e.g., within 5%) that are deemed acceptable in the industry without departing from the aspects of the implementations described herein. For example, CTE matched materials may practically have a difference of up to 5% of on another.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "above," "upper," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:
1. A system, comprising:
   a busbar to conduct a current, wherein the busbar includes
      a sensing structure that includes a defined region of the busbar having a reduced area for current flow to increase a magnetic field produced by the current;

a magnetic sensor to sense the magnetic field produced by the current in the defined region of the busbar, wherein the magnetic sensor is arranged near the sensing structure; and a thermal element in or near the sensing structure, wherein the thermal element is made of an electrically insulating material and facilitates dissipation of heat through the sensing structure of the busbar, wherein the sensing structure includes one or more slits or tapers formed in the busbar to define the defined region of the busbar having the reduced area, wherein the thermal element comprises a thermal filler premold that is arranged within one or more portions of the sensing structure, wherein the thermal filler premold fills the one or more slits or tapers such that the thermal element is integrated in the busbar, co-planar with the busbar, and wherein the thermal filler premold is coupled to the defined region of the busbar to dissipate heat from the defined region of the busbar.

2. The system of claim 1, wherein the thermal element comprises a thermal plate that is arranged on, over, or around one or more portions of the sensing structure.

3. The system of claim 1, wherein the thermal element comprises a material with a comparative tracking index that is greater than approximately 250 volts such that the thermal element is configured to prevent current leakage from the sensing structure into the thermal element and enable the sensing structure to increase the magnetic field.

4. The system of claim 1, wherein the thermal element comprises a non-magnetic material to prevent distortion of the magnetic field.

5. The system of claim 1, wherein the thermal element comprises a material with a coefficient of thermal expansion (CTE) that matches a CTE of a material of the busbar to reduce stress at an interface between the busbar and the thermal element.

6. The system of claim 1, wherein the thermal element comprises a material with a thermal conductivity that is greater than approximately 5 Watts per meter Kelvin to dissipate heat produced by the sensing structure.

7. The system of claim 1, wherein the magnetic sensor is arranged within an opening in the busbar such that a plane of the magnetic sensor is substantially perpendicular to a plane of the busbar.

8. The system of claim 1, wherein the magnetic sensor is arranged adjacent to the busbar such that a plane of the magnetic sensor is substantially parallel to a plane of the busbar.

9. The system of claim 1, wherein the thermal element is configured to prevent current leakage from the sensing structure into the thermal element and enable the sensing structure to increase the magnetic field.

10. The system of claim 1, wherein the thermal element is configured to prevent current leakage from the defined region of the busbar into the thermal element and enable the sensing structure to increase the magnetic field.

11. The system of claim 1, wherein the thermal element is integrated with the sensing structure such that the thermal element is thermally coupled directly with the defined region of the busbar to dissipate heat produced by the defined region.

12. A system, comprising:
a busbar including a sensing structure, wherein the sensing structure comprises one or more slits or tapers formed in the busbar that define a defined region of the busbar having a reduced area for current flow in the defined region of the busbar to increase a magnetic field produced by a current; and a thermal element associated with one or more portions of the sensing structure, wherein the thermal element is made of an electrically insulating material and facilitates dissipation of heat produced in the defined region of the busbar, wherein the thermal element comprises a thermal filler premold made of the electrically insulating material, wherein the thermal filler premold fills the one or more slits or tapers such that the thermal element is integrated in the busbar, co-planar with the busbar, and wherein the thermal filler premold is coupled to the defined region of the busbar to dissipate heat from the defined region of the busbar.

13. The system of claim 12, wherein the thermal element comprises a thermal plate made of the electrically insulating material, and wherein the thermal plate is coupled to the defined region of the busbar to dissipate heat from the define region of the busbar.

14. The system of claim 12, wherein the thermal element comprises a material with a comparative tracking index that is greater than approximately 250 volts such that the thermal element is configured to prevent current leakage from the sensing structure into the thermal element and enable the sensing structure to increase the magnetic field.

15. The system of claim 12, wherein the thermal element comprises a non-magnetic material to prevent distortion of the magnetic field.

16. The system of claim 12, wherein the thermal element comprises a material with a coefficient of thermal expansion (CTE) that matches a CTE of a material of the busbar to reduce stress at an interface between the busbar and the thermal element.

17. The system of claim 12, wherein the thermal element comprises a material with a thermal conductivity that is greater than approximately 5 Watts per meter Kelvin to dissipate heat produced by the sensing structure.

18. A system, comprising:
a busbar to conduct a current and to provide dissipation of heat from a power device, wherein the busbar includes a sensing structure associated with increasing a magnetic field produced by the current, wherein the sensing structure includes a defined region of the busbar having a reduced area for current flow to increase the magnetic field produced by the current;

a magnetic sensor to sense the magnetic field produced by the current in the defined region of the busbar near the sensing structure; and a thermal element to facilitate the dissipation of heat from the power device through the sensing structure of the busbar, wherein the thermal element is made of an electrically insulating material and comprises a thermal filler premold that is provided within one or more portions of the sensing structure or comprises a thermal plate that is on or over one or more portions of the sensing structure, wherein the thermal element comprises at least one of a material with a comparative tracking index that is greater than approximately 250 volts to prevent current leakage from the sensing structure into the thermal element, a non-magnetic material to prevent distortion of the magnetic field, a material with a coefficient of thermal expansion (CTE) that matches a CTE of a material of the busbar to reduce stress at an interface between the busbar and the thermal element, or a material with a thermal conductivity that is greater than approximately 5 Watts per meter Kelvin to dissipate heat produced by the sensing structure.

19. The system of claim 18, wherein the magnetic sensor is arranged within an opening in the busbar such that a plane of the magnetic sensor is substantially perpendicular to a plane of the busbar.

20. The system of claim 18, wherein the magnetic sensor is arranged adjacent to the busbar such that a plane of the magnetic sensor is substantially parallel to a plane of the busbar.

21. The system of claim 18, wherein the thermal element is thermally coupled with the defined region of the busbar to dissipate heat produced by the defined region.

22. A system, comprising:
   a busbar to conduct a current, wherein the busbar includes a sensing structure that includes a defined region of the busbar having a reduced area for current flow to increase a magnetic field produced by the current; and
   a thermal element in or near the sensing structure, wherein the thermal element is made of an electrically insulating material and facilitates dissipation of heat through the sensing structure of the busbar,
   wherein the thermal element comprises at least one of a material with a comparative tracking index that is greater than approximately 250 volts to prevent current leakage from the sensing structure into the thermal element, or a material with a coefficient of thermal expansion (CTE) that matches a CTE of a material of the busbar to reduce stress at an interface between the busbar and the thermal element.

* * * * *